United States Patent
Cirocco

(10) Patent No.: US 6,379,045 B1
(45) Date of Patent: Apr. 30, 2002

(54) QUICK DISCONNECT SLIDE ASSEMBLY

(75) Inventor: Paul Cirocco, Yorba Linda, CA (US)

(73) Assignee: Jonathan Manufacturing Corporation, Fullerton, CA (US)

( * ) Notice: Subject to any disclaimer, the term of this patent is extended or adjusted under 35 U.S.C. 154(b) by 0 days.

(21) Appl. No.: 09/663,527

(22) Filed: Sep. 15, 2000

Related U.S. Application Data

(60) Provisional application No. 60/190,422, filed on Mar. 17, 2000.

(51) Int. Cl.⁷ ................................ A47B 88/10
(52) U.S. Cl. ................... 384/18; 312/334.11
(58) Field of Search ............... 384/18, 22; 312/334.8, 312/334.11, 334.17, 334.25, 334.26, 334.34, 334.36, 334.37, 334.38

(56) References Cited

U.S. PATENT DOCUMENTS

| | | | |
|---|---|---|---|
| 3,937,531 A | 2/1976 | Hagen et al. | |
| 4,458,964 A | 7/1984 | Hardy | 312/334.47 |
| 4,537,450 A * | 8/1985 | Baxter | 384/18 |
| 4,696,582 A * | 9/1987 | Kasten | 384/18 |
| 5,405,195 A | 4/1995 | Hobbs | 312/334.46 |
| 5,484,197 A | 1/1996 | Hansen et al. | 312/334.12 |
| 5,577,821 A * | 11/1996 | Chu | 312/334.11 |
| 5,851,059 A * | 12/1998 | Cirocco | 312/334.11 |

FOREIGN PATENT DOCUMENTS

JP    4-96711    8/1990

* cited by examiner

Primary Examiner—Thomas R. Hannon
(74) Attorney, Agent, or Firm—Knobbe, Martens, Olson & Bear LLP

(57) ABSTRACT

A slide assembly is provided having a first slide segment defining a channel and a second slide segment movable in the channel to extend or retract the slide assembly. A bearing assembly is provided in the channel to facilitate sliding movement of the second slide segment with respect to the first slide segment. The bearing assembly comprises a number of ball bearings and a bearing retainer. A guide is provided at an end of the bearing retainer to guide an end of the second slide segment past the end of the bearing retainer as the slide assembly is retracted.

35 Claims, 6 Drawing Sheets

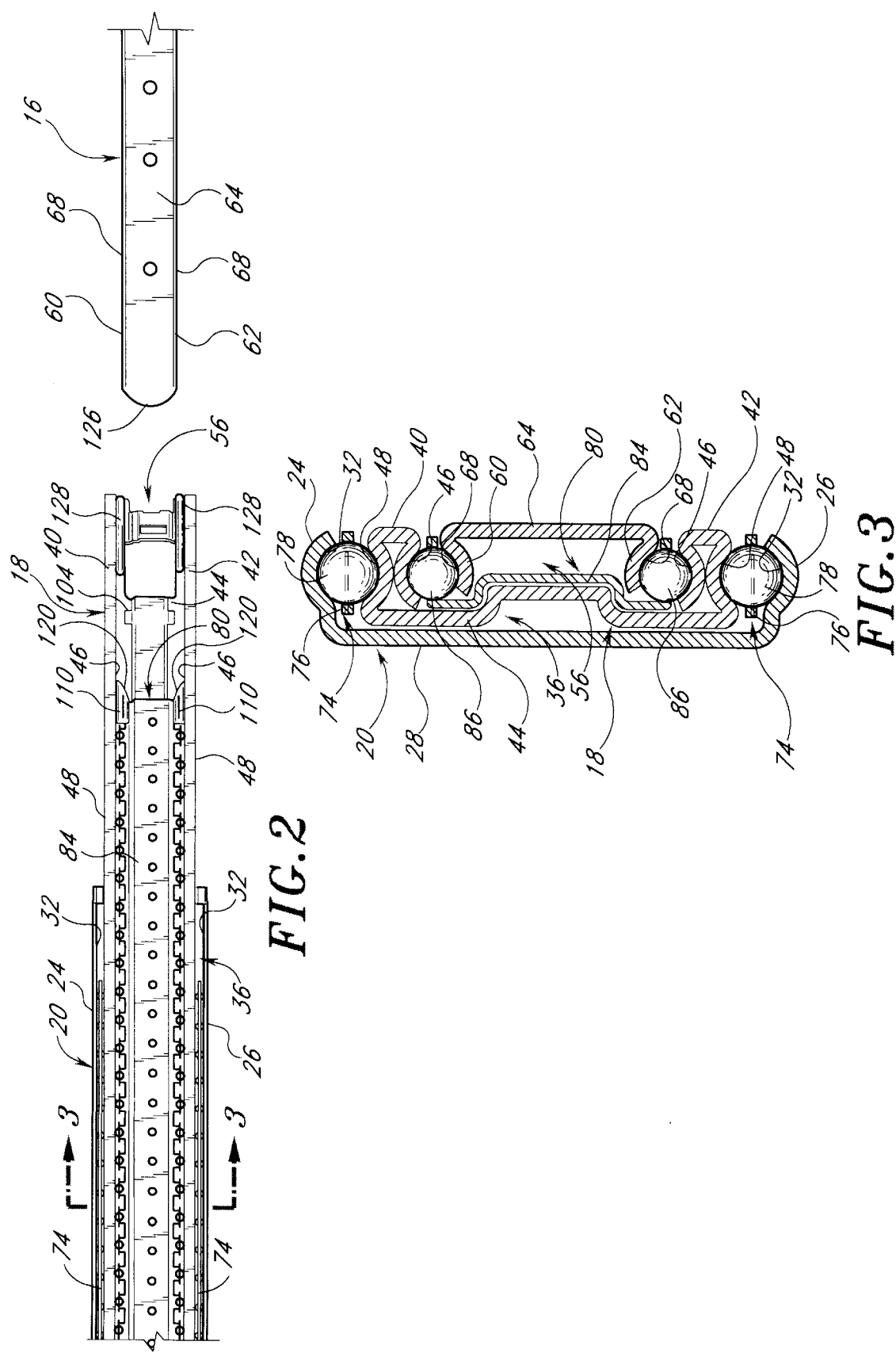

QUICK DISCONNECT SLIDE ASSEMBLY

PRIORITY INFORMATION

This application claims priority from U.S. Provisional Patent Application No. 60/190,422, filed Mar. 17, 2000 and hereby expressly incorporated by reference herein.

BACKGROUND OF THE INVENTION

1. Field of the Invention

The present invention relates to slide assemblies and, more particular, to slide assemblies for slidably supporting computer servers in server rack structures.

2. Description of the Related Art

For convenience and to conserve floor space, computer servers for high-capacity computer systems are often mounted in rack structures. Typically, several computer servers are mounted in each rack structure. Each server is typically mounted on a pair of slide assemblies to allow the server to slide in and out of the rack structure for convenient access to the server.

Each slide assembly comprises two or more slide segments. In slide assemblies comprising only two slide segments, a first or outer slide segment is mounted to a frame of the rack structure, and a second or inner slide segment is mounted to the server. The outer slide segment defines a channel. The inner slide segment is movably in the channel to extend or retract the slide assembly. A bearing assembly is movably positioned in the channel to facilitate sliding movement of the inner slide segment with respect to the outer slide segment.

In quick disconnect slide assemblies, the inner slide segment can be entirely removed from the channel and detached from the outer slide segment. This allows quick and convenient removal of the computer server from the server rack structure for repair or replacement of the computer server. The inner slide segment remains attached to the computer server when the computer server is removed from the server rack.

To replace the computer server in the server rack, an end of the inner slide segment must be guided back into the channel of the outer slide segment. Because each computer server is typically supported by a pair of slide assemblies, the ends of the inner slide segments of both slide assemblies must be guided into the channels of the outer slide segments substantially in unison. This often proves difficult since the computer servers are typically heavy and awkward to handle.

If the inner slide segment is not properly aligned in the channel, the end of the inner slide segment can interfere with a forward end of the bearing assembly. As the end of the inner slide segment is moved towards the rear of the channel, the end of the inner slide segment pushes the bearing assembly with it. When the bearing assembly reaches the end of the channel, the forward end of the bearing assembly prevents the inner slide segment from further rearward movement in the channel. The inner slide segment, along with the attached computer server, must then be moved forwardly and realigned in the channel before further rearward movement of the inner slide segment is possible. In addition to being inconvenient, if the inner slide segment strikes the bearing assembly with sufficient force, damage to the bearing assembly or other components of the slide assembly can result.

Prior art solutions have included various means for retaining the bearing assembly towards the front of the channel while the inner slide segment is inserted in the channel. This makes it easier to ensure that the end of the inner slide segment does not interfere with the forward end of the bearing assembly when the inner slide assembly is inserted in the channel. Such prior art solutions, however, have proven unreliable and inconvenient, typically requiring manual placement and locking of the bearing assembly near the front of the channel prior to insertion of the inner slide segment. In addition, they pose a risk of interfering with normal operation of the slide assembly.

SUMMARY OF THE INVENTION

The slide assembly of the present invention provides convenient and reliable means for guiding an end of a first slide segment past an end of a bearing assembly located in a channel of a second slide assembly.

In accordance with one aspect of the present invention, a slide assembly is provided having a first slide segment defining a channel and a second slide segment movable in the channel to extend or retract the slide assembly. A bearing assembly is provided in the channel to facilitate sliding movement of the second slide segment with respect to the first slide segment. The bearing assembly comprises a number of ball bearings and a bearing retainer. A guide is provided at an end of the bearing retainer to guide an end of the second slide segment past the end of the bearing retainer as the slide assembly is retracted.

In accordance with another aspect of the present invention, a slide assembly is provided having a first slide segment defining a channel. The channel is defined by an upper bearing surface, a lower bearing surface, and a side surface extending between the upper and lower bearing surfaces. A second slide segment is movable forwardly in the channel to extend the slide segment and rearwardly in the channel to retract the slide assembly. A bearing assembly is provided in the channel to facilitate sliding movement of the second slide segment with respect to the first slide segment. The bearing assembly comprises a number of ball bearings and a bearing retainer. A guide is provided at an end of the bearing retainer. The guide defines a guide surface extending rearwardly and towards a central longitudinal axis of the slide assembly from at least one of the upper and lower bearing surfaces.

In accordance with yet another aspect of the present invention, a slide assembly is provided having a first slide segment defining a channel. A second slide segment is movable forwardly in the channel to extend the slide assembly and rearwardly in the channel to retract the slide assembly. A bearing assembly is provided in the channel to facilitate sliding movement of the second slide segment with respect to the first slide segment. The bearing assembly comprises a number of ball bearings and a bearing retainer. The bearing retainer comprises an upper retainer portion and a lower retainer portion. A guide is provided at an end of the bearing retainer. The guide defines a guide surface extending rearwardly and towards a central longitudinal axis of the slide assembly from at least one of the upper and lower retainer portions.

These and other aspects of the present invention will become readily apparent to those skilled in the art from the following detailed description of the preferred embodiments and the attached figures, the invention not being limited to any particular embodiment disclosed herein.

BRIEF DESCRIPTION OF THE DRAWINGS

FIG. 2 is a side elevational view of a portion of the slide assembly of FIG. 1, with the inner slide segment shown detached from the intermediate slide segment;

FIG. 3 is a cross-sectional view of the slide assembly of FIG. 1, taken along line 3—3 of FIG. 2;

DETAILED DESCRIPTION OF THE PREFERRED EMBODIMENT

Figure 1:
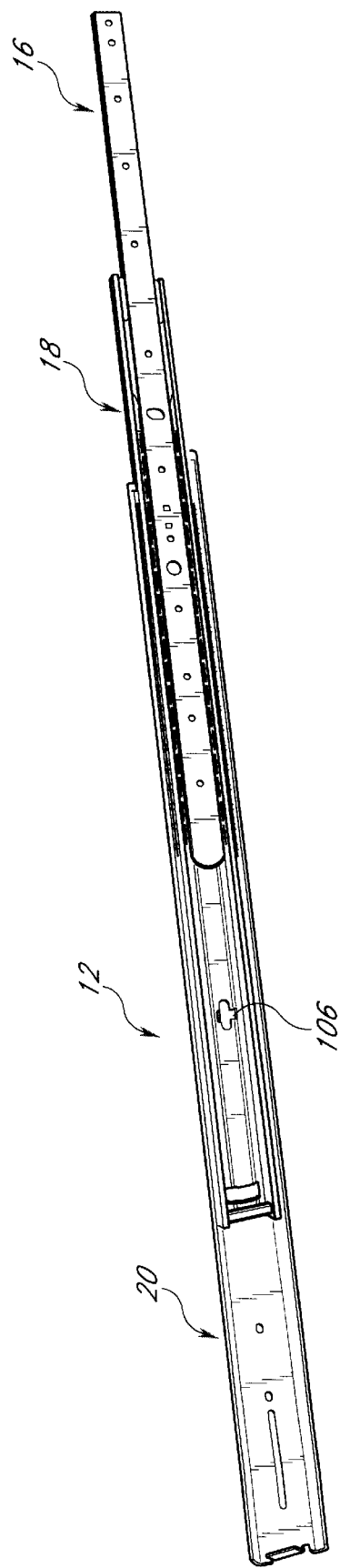
FIG. 1 is a perspective view of one embodiment of a slide assembly having features in accordance with the present invention.

A slide assembly having features in accordance with the present invention is illustrated in FIG. 1 and designated generally by the reference numeral 12. In the embodiment illustrated in FIG. 1, the slide assembly 12 includes a first or inner slide segment 16, a second or intermediate slide segment 18, and a third or outer slide segment 20. The inner slide segment 16 is adapted for mounting to an outer case or housing of a computer server (not shown). The outer slide segment 20 is adapted for mounting to a stationary server rack structure (not shown). Each computer server desirably is supported in the server rack structure by a pair of slide assemblies 12, one on either side of the computer server, to allow the computer server to slide in and out of the server rack structure.

With reference to FIGS. 2 and 3, the outer slide segment 20 has a generally C-shaped cross-section and comprises an upper wall 24, a lower wall 26, and a planar side wall 28 extending between the upper and lower walls 24, 26. Each of the upper and lower walls 24, 26 defines an arcuate bearing surface 32. The bearing surfaces 32 generally face inward towards a central longitudinal axis β (see FIGS. 5–7) of the slide assembly 12. A longitudinal channel 36 is defined by the bearing surfaces 32 and a planar inner surface of the side wall 28.

The intermediate slide segment 18 also has a generally C-shaped cross-section and comprises an upper wall 40, a lower wall 42, and a side wall 44 extending between the upper and lower walls 40, 42. Each of the upper and lower walls 40, 42 of the intermediate slide segment 18 defines an arcuate inner bearing surface 46 and an arcuate outer bearing surface 48. The inner bearing surfaces 46 face towards, and the outer bearing surfaces 48 face away from, the central longitudinal axis β of the slide assembly 12. A longitudinal channel 56 is defined by the inner bearing surfaces 46 and a planar inner surface of the side wall 44.

Like the outer slide segment 20 and the intermediate slide segment 18, the inner slide segment 16 also has a generally C-shaped cross-section and comprises an upper wall 60, a lower wall 62, and a side wall 64 extending between the upper and lower walls 60, 62. Each of the upper and lower walls 60, 62 defines an arcuate bearing surface 68. The bearing surfaces 68 of the inner slide segment 16 face outward, or away from the central longitudinal axis β of the slide assembly 12.

The intermediate slide segment 18 is positioned in the channel 36 of the outer slide segment 20 so that the bearing surfaces 32 of the outer slide segment 20 are located adjacent the outer bearing surfaces 48 of the intermediate slide segment 18. A bearing assembly 74 is positioned between each bearing surface 32 of the outer slide segment 20 and the adjacent outer bearing surface 48 of the intermediate slide segment 18. In the illustrated embodiment, each bearing assembly 74 comprises a thin, elongate, generally planar bearing spacer 76 and a number of spherical ball bearings 78. The ball bearings 78 are retained by the bearing spacer 76 in spaced-apart openings formed along the length of the bearing spacer 76. The ball bearings 78 roll against the bearing surfaces 32, 48 to facilitate longitudinal sliding movement of the intermediate slide segment 18 with respect to the outer slide segment 20. As will be appreciated, the bearings 78 are retained in the openings of the spacer 76 by the bearing surfaces 32, 48.

Referring still to FIGS. 2 and 3, the inner slide segment 16 is positioned in the channel 56 of the intermediate slide segment 18 so that the bearing surfaces 68 of the inner slide segment 16 are located adjacent the inner bearing surfaces 46 of the intermediate slide segment 18. A bearing assembly 80 is positioned in the channel 56 between the inner slide segment 16 and the intermediate slide segment 18 to facilitate longitudinal sliding movement of the inner slide segment 16 with respect to the intermediate slide segment 18. In the illustrated embodiment, the bearing assembly 80 comprises a bearing retainer 84 and a number of ball bearings 86.

Figure 4:
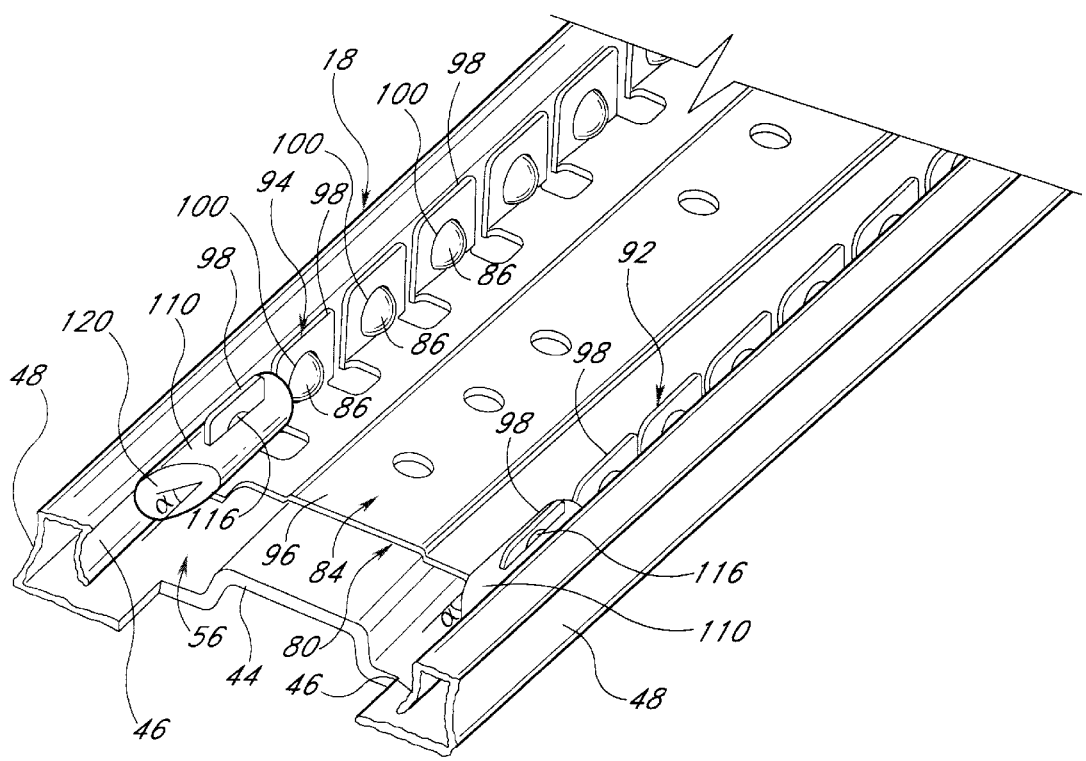
FIG. 4 is a perspective view of a portion of the intermediate slide segment and bearing assembly of FIG. 1, with a pair of guides provided at a forward end of the bearing assembly.

FIG. 4 is a perspective view of a portion of the intermediate slide segment 18 with the bearing assembly 80 positioned in the channel 56. In the embodiment illustrated, the bearing retainer 84 comprises an upper retainer portion 92, a lower retainer portion 94, and a side portion 96 interconnecting the upper and lower retainer portions 92, 94. The bearing retainer 84 is seated in the channel 56 so that the upper and lower retainer portions 92, 94 are located adjacent the inner bearing surfaces 46, and the side portion 96 is located adjacent the inner surface of the side wall 44.

In the illustrated embodiment, each of the upper and lower retainer portions 92, 94 comprises a number of tabs 98. The tabs 98 extend generally perpendicularly to the side portion 96 of the bearing retainer 84. Each tab 98 has a circular opening 100 provided therein to accommodate one of the ball bearings 86. The diameter of the openings 100 is preferably slightly less than the diameter of the ball bearings 86 to trap the ball bearings 86 between the tabs 98 and the inner bearing surfaces 46 of the intermediate slide segment 18.

The bearing surfaces 32 of the outer slide segment 20, the inner and outer bearing surfaces 46, 48 of the intermediate slide segment 18, and the bearing surfaces 68 of the inner slide segment 16 are desirably concave. This prevents lateral separation of the intermediate slide segment 18 from the outer slide segment 20, and of the inner slide segment 16 from the intermediate slide segment 18.

The bearing assembly 80 desirably is movable along the length of the channel 56 of the intermediate slide segment 18. This allows the ball bearings 86 to roll along the inner bearing surfaces 46 of the intermediate slide segment 18 when the inner slide segment 16 is moved in and out of the channel 56. A front stop 104 (see FIG. 2) is provided near a forward end of the intermediate slide segment 18 to prevent the bearing assembly 80 from sliding out of the channel 56. A rear stop 106 (see FIG. 1) is provided near a rear end of the intermediate slide segment 18 to limit rearward movement of the bearing assembly 80. In the illustrated embodiment, the front and rear stops 104, 106 comprise laterally raised portions on the inner surface of the side wall 44 of the intermediate slide segment 18.

With reference to FIG. 4, a guide 110 is provided at a forward end of each of the upper and lower retainer portions 92, 94. In the illustrated embodiment, each guide 110 is generally cylindrical in shape and has a diameter approximating that of the ball bearings 86. For reasons that will become apparent, the guides 110 are desirably made of a durable, low-friction plastic material, such as acetel. However, other materials can also be used.

Each guide 110 has an opening or slot 116 formed along a longitudinal axis thereof. The shape of the slot 116 generally corresponds with a cross-sectional shape of the tabs 98. To retrofit the guides 110 on an existing slide assembly 12, the ball bearing 86 may be removed from the opening 100 in an end one of the tabs 98 of each of the upper and lower retainer portions 92, 94. The guides 110 are then placed over the tabs 98 so that the tabs 98 extend through the openings 116. The cylindrical guides 110 rest against the concave inner bearing surfaces 46 of the intermediate slide segment 18 to retain the guides 110 in place on the tabs 98.

Referring still to FIG. 4, each guide 110 defines a guide surface 120 at a forward portion thereof. In the illustrated embodiment, the guide surfaces 120 extend rearwardly and towards the central longitudinal axis β of the slide assembly 12 from the inner bearing surfaces 46 of the intermediate slide segment 18.

The slide assembly 12 of the illustrated embodiment is of the quick disconnect type. As illustrated in FIG. 2, the inner slide segment 16 can be entirely removed from the channel 56 of the intermediate slide segment 18. This allows quick and convenient removal of the computer server from the server rack structure for repair or replacement of the computer server. The inner slide segment 16 remains attached to the computer server when the computer server is removed from the server rack.

Figure 5:
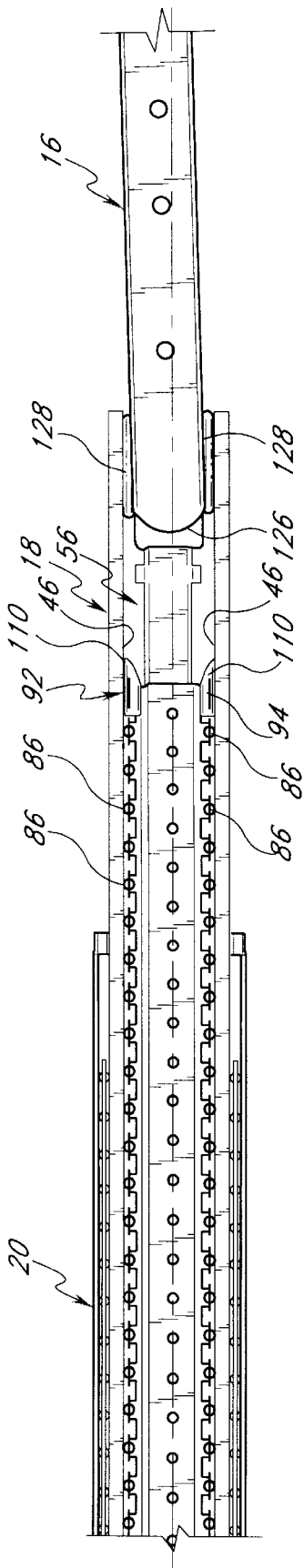
FIG. 5 is a side elevational view of a portion of the slide assembly of FIG. 1, with an end of the inner slide segment shown inserted in a forward end of the channel of the intermediate slide segment.

To replace the computer server in the server rack, an end 126 of the inner slide segment 16 must be guided back into the channel 56 of the intermediate slide segment 18, as illustrated in FIG. 5. Typically, another slide assembly 12 is provided on an opposite side of the computer server, and the ends 126 of the inner slide segments 16 of both slide assemblies 12 must be guided into the channels 56 substantially in unison. Because computer servers are typically heavy and awkward to handle, this is can often be difficult. A pair of lead-in members 128 can optionally be provided at the forward end of the intermediate slide segment 18 to help guide the inner slide segment 16 into the channel 56.

Even after the end 126 of inner slide segment 16 has been properly inserted in the channel 56 of the intermediate slide segment 18, the inner slide segment 16 is nevertheless prone to misalignment in the channel 56. The distance between the inner bearing surfaces 46 of the intermediate slide segment 18 is necessarily greater than the height of the of the inner slide segment 16 in order to accommodate the ball bearings 86. As a result, the inner slide segment 16 can become misaligned with respect to the longitudinal axis of the slide assembly 12.

When the inner slide segment 16 is not properly aligned in the channel 56, the end 126 of the inner slide segment 16 can interfere with the forward ends of the upper and lower retainer portions 92, 94. As the inner slide segment 16 is moved towards the rear of the channel 56, the end of the inner slide segment 16 can thus push the bearing assembly 80 with it. When the rear end of the bearing assembly 80 abuts the rear stop 160, the forward end of the bearing assembly 80 prevents the inner slide segment 16 from further rearward movement in the channel 56. The inner slide segment 16, along with the attached computer server, must then be moved forwardly and realigned in the channel 56 before further rearward movement of the inner slide segment 16 is possible. In addition to being inconvenient, if the inner slide segment 16 strikes the bearing assembly with sufficient force, damage to the bearing assembly 80 or other components of the slide assembly 12 can result.

Figure 6:
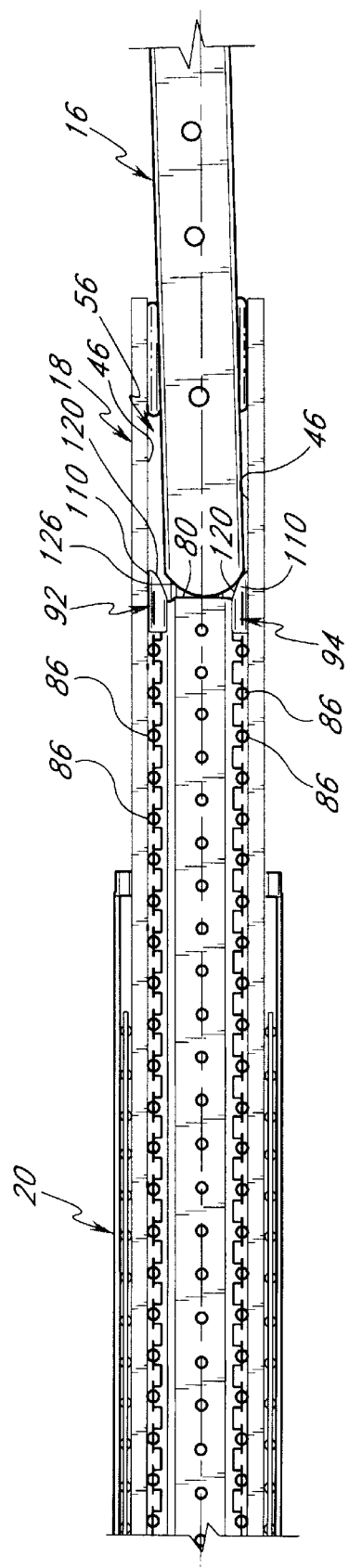
FIG. 6 is a side elevational view of a portion of the slide assembly of FIG. 1, with the end of the inner slide segment shown in the channel of the intermediate slide segment and contacting one of the guides provided at the forward end of the bearing assembly.
Figure 7:
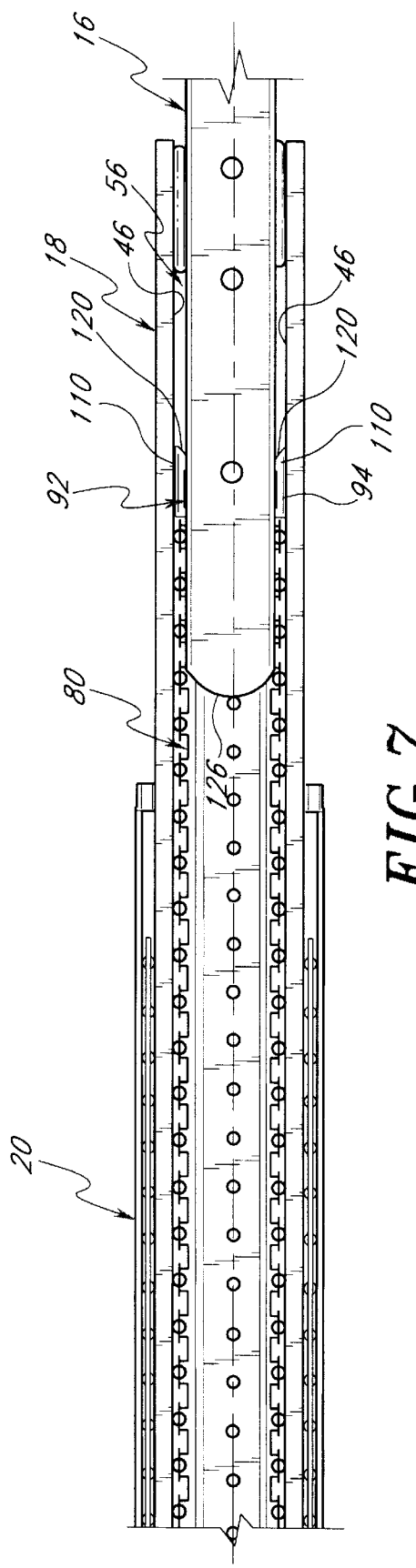
FIG. 7 is a side elevational view of a portion of the slide assembly of FIG. 1, with the end of the inner slide segment shown in the channel of the intermediate slide segment having passed the forward end of the bearing assembly.

In the illustrated embodiment, the guides 110 provided at the forward ends of the upper and lower retainer portions 92, 94 serve to guide the end 126 of the inner slide segment 16 past the forward end of the bearing retainer 84 as the inner slide segment 16 is moved towards the rear of the channel 56. If the inner slide segment 16 is misaligned so that the end 126 of the inner slide segment 16 is angled towards the lower retainer portion 94, as illustrated in FIG. 6, the end 126 of the inner slide segment 16 abuts the guide surface 120 of the guide 110 located at the end of the lower retainer portion 94. The guide surface 120 guides the end 126 of the inner slide segment 16 over the forward end of the lower retainer portion 94, thereby allowing the end 126 of the inner slide segment 16 to pass between the upper and lower retainer portions 92, 94, as illustrated in FIG. 7. The guide 110 thus prevents the end 126 of the inner slide segment 16 from catching on the lower retainer portion 94 and pushing the bearing assembly 80 back to the rear of the channel 56. The guide 110 at the upper retainer portion 92 works in similar fashion when the end 126 of the inner slide segment 16 is angled towards the upper retainer portion 92.

As illustrated in FIG. 4, the guide surfaces 120 are disposed at an oblique angle α with respect to a longitudinal axis of the slide assembly 12. Desirably, the angle α of at least a portion of each guide surface 120 with respect to the longitudinal axis of the slide assembly 12 is between 10 and 45 degrees. More desirably, the angle α of at least a portion of each guide surface 120 with respect to the longitudinal axis of the slide assembly 12 is between 15 and 30 degrees. This angled configuration of the guide surfaces 120 functions well to guide the end 126 of the inner slide segment 16 past the forward ends of the upper and lower retainer portions 92, 94 as the inner slide segment 16 is moved rearwardly in the channel 56. When the end 126 of the inner slide segment 16 abuts one of the angled guide surfaces 120, it slides along the guide surface 120 and is guided between the upper and lower retainer portions 92, 94 of the bearing assembly 80.

The low-friction plastic material from which the guides 110 are preferably fabricated allows the end 126 of the inner slide segment 16 to slide along the guide surfaces 120 with little frictional resistance. Desirably, the dynamic coefficient of friction between the guide surfaces 120 and the end 126 of the inner slide segment 16 is less than 0.40. More desirably, the dynamic coefficient of friction between the guide surfaces 120 and the end 126 of the inner slide segment is less than 0.25.

It will be recognized by those skilled in the art that other guide surface configurations can alternatively be used, including various non-planar guide surface configurations. Due consideration must be given, however, to the goal of guiding the end 126 of the inner slide segment 16 past the bearing assembly 80 as the inner slide segment 16 is moved rearwardly in the channel 56. In addition, in the illustrated embodiment, the guide surfaces 120 generally extend from the inner bearing surfaces 46 and beyond the tabs 98. This is desirable to ensure that the end 126 of the inner slide segment 16 is not caught on the tabs 98, or in the spaces between the inner bearing surfaces 46 and the tabs 98, as the inner slide segment is moved through the channel 56. Although less desirable, the guide surfaces can alternatively be configured to extend only from the bearing surfaces 46 to the tabs 98, or from the tabs 98 towards the central longitudinal axis β of the slide assembly 12.

In the illustrated embodiment, the guides 110 are fabricated separately from the bearing assembly 80, and thus can be added to existing slide assemblies with relative ease. Alternatively, however, the guides 110 can be fabricated integrally with the bearing assembly 80. In addition, while the bearing assembly 80 of the illustrated embodiment is unitary (i.e., the upper and lower retainer portions 92, 94 are interconnected by the side portion 96), the guides 110 also function when the upper and lower retainer portions 92, 94 are separate and move independently of one another.

Although the slide assembly 12 of the illustrated embodiment includes an inner slide segment 16, an intermediate slide segment 18, and an outer slide segment 20, those skilled in the art will recognize that the guides 110 are useful in slide assemblies having two or more slide segments. Thus, the guides 110 can be used in slide assemblies having more than one intermediate slide segment, or no intermediate slide segment.

Although the invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. Thus, it is intended that the scope of the present invention herein disclosed should not be limited by the particular disclosed embodiments described above, but should be determined only by a fair reading of the claims that follow.

What is claimed is:

1. A slide assembly, comprising:
   a first slide segment defining a channel;
   a second slide segment movable in said channel to extend or retract said slide assembly;
   a bearing assembly located in said channel and facilitating sliding movement of said second slide segment with respect to said first slide segment, said bearing assembly comprising a number of ball bearings and a bearing retainer; and
   a guide at an end of said bearing retainer, said guide adapted to guide an end of said second slide segment past said end of said bearing retainer as said slide assembly is retracted.

2. The slide assembly of claim 1, wherein said bearing retainer comprises an upper retainer portion, a lower retainer portion, and a side portion interconnecting said upper and lower retainer portions, and said guide is located at an end of at least one of said upper and lower retainer portions.

3. The slide assembly of claim 2, wherein said channel is defined by an upper bearing surface, a lower bearing surface, and a side surface extending between said upper and lower bearing surfaces, said upper retainer portion being located adjacent said upper bearing surface and said lower retainer portion being located adjacent said lower bearing surface, and said guide defines a guide surface, said guide surface extending between said end of said at least one of said upper and lower retainer portions and an adjacent one of said upper and lower bearing surfaces.

4. The slide assembly of claim 3, wherein at least a portion of said guide surface is disposed at an oblique angle with respect to a longitudinal axis of said slide assembly.

5. The slide assembly of claim 4, wherein said angle is between 10 and 45 degrees.

6. The slide assembly of claim 4, wherein said angle is between 15 and 30 degrees.

7. The slide assembly of claim 3, wherein a dynamic coefficient of friction between said guide surface and said inner slide segment is less than 0.40.

8. The slide assembly of claim 3, wherein a dynamic coefficient of friction between said guide surface and said inner slide segment is less than 0.25.

9. The slide assembly of claim 2, wherein each of said upper and lower retainer portions comprises a number of tabs, each tab having an opening formed therein to accommodate one of said ball bearings, and an opening is formed in said guide to accommodate one of said tabs and thereby secure said guide to said at least one of said upper and lower retainer portions.

10. The slide assembly of claim 1, wherein said guide is formed integrally with said bearing retainer.

11. The slide assembly of claim 1, wherein said guide is formed of a low-friction plastic material.

12. The slide assembly of claim 1, wherein said bearing assembly is moveable in said channel.

13. The slide assembly of claim 1, wherein said second slide segment is entirely removable from said channel and detachable from said first slide segment.

14. A slide assembly, comprising:
   a first slide segment defining a channel, said channel defined by an upper bearing surface, a lower bearing surface, and a side surface extending between said upper and lower bearing surfaces;
   a second slide segment movable forwardly in said channel to extend said slide segment and rearwardly in said channel to retract said slide assembly;
   a bearing assembly located in said channel and facilitating sliding movement of said second slide segment with respect to said first slide segment, said bearing assembly comprising a number of ball bearings and a bearing retainer; and
   a guide at an end of said bearing retainer, said guide defining a guide surface extending rearwardly and towards a central longitudinal axis of said slide assembly from at least one of said upper and lower bearing surfaces.

15. The slide assembly of claim 14, wherein said bearing retainer comprises an upper retainer portion located adjacent said upper bearing surface and a lower retainer portion located adjacent said lower bearing surface, and said guide is located at an end of at least one of said upper and lower retainer portions.

16. The slide assembly of claim 14, wherein at least a portion of said guide surface is disposed at an oblique angle with respect to a longitudinal axis of said slide assembly of between 10 and 45 degrees.

17. The slide assembly of claim 14, wherein at least a portion of said guide surface is disposed at an oblique angle with respect to a longitudinal axis of said slide assembly of between 15 and 30 degrees.

18. The slide assembly of claim 14, wherein each of said upper and lower retainer portions comprises a number of tabs, each tab having an opening formed therein to accommodate one of said ball bearings, and an opening is formed in said guide to accommodate one of said tabs and thereby secure said guide to said at least one of said upper and lower retainer portions.

19. The slide assembly of claim 14, wherein said guide is formed integrally with said bearing retainer.

20. The slide assembly of claim 14, wherein a dynamic coefficient of friction between said guide surface and said inner slide segment is less than 0.40.

21. The slide assembly of claim 14, wherein a dynamic coefficient of friction between said guide surface and said inner slide segment is less than 0.25.

22. The slide assembly of claim 14, wherein said guide is formed of a low-friction plastic material.

23. The slide assembly of claim 14, wherein said bearing assembly is moveable in said channel.

24. The slide assembly of claim 14, wherein said second slide segment is entirely removable from said channel and detachable from said first slide segment.

25. A slide assembly, comprising:
a first slide segment defining a channel;
a second slide segment movable forwardly in said channel to extend said slide assembly and rearwardly in said channel to retract said slide assembly;
a bearing assembly located in said channel and facilitating sliding movement of said second slide segment with respect to said first slide segment, said bearing assembly comprising a number of ball bearings and a bearing retainer, said bearing retainer comprising an upper retainer portion and a lower retainer portion; and
a guide at an end of said bearing retainer, said guide defining a guide surface extending rearwardly and towards a central longitudinal axis of said slide assembly from at least one of said upper and lower retainer portions.

26. The slide assembly of claim 25, wherein said channel is defined by an upper bearing surface, a lower bearing surface, and a side surface extending between said upper and lower bearing surfaces, said upper retainer portion being located adjacent said upper bearing surface and said lower retainer portion being located adjacent said lower bearing surface, and said guide is located at an end of at least one of said upper and lower retainer portions.

27. The slide assembly of claim 25, wherein said guide surface is disposed at an oblique angle with respect to a longitudinal axis of said slide assembly of between 10 and 45 degrees.

28. The slide assembly of claim 25, wherein said guide surface is disposed at an oblique angle with respect to a longitudinal axis of said slide assembly of between 15 and 30 degrees.

29. The slide assembly of claim 25, wherein each of said upper and lower retainer portions comprises a number of tabs, each tab having an opening formed therein to accommodate one of said ball bearings, and an opening is formed in said guide to accommodate one of said tabs and thereby secure said guide to said at least one of said upper and lower retainer portions.

30. The slide assembly of claim 25, wherein said guide is formed integrally with said bearing retainer.

31. The slide assembly of claim 25, wherein a dynamic coefficient of friction between said guide surface and said inner slide segment is less than 0.40.

32. The slide assembly of claim 25, wherein a dynamic coefficient of friction between said guide surface and said inner slide segment is less than 0.25.

33. The slide assembly of claim 25, wherein said guide is formed of a low-friction plastic material.

34. The slide assembly of claim 25, wherein said bearing assembly is moveable in said channel.

35. The slide assembly of claim 25, wherein said second slide segment is entirely removable from said channel and detachable from said first slide segment.

* * * * *